United States Patent
Tsai et al.

(10) Patent No.: US 7,826,519 B1
(45) Date of Patent: Nov. 2, 2010

(54) METHOD AND APPARATUS FOR PROVIDING COHERENT PHASE NOISE IN TRANSCEIVERS OR SIMILAR SYSTEMS

(75) Inventors: King Chun Tsai, San Jose, CA (US); Lawrence Tse, Fremont, CA (US)

(73) Assignee: Marvell International, Ltd, Hamilton (BM)

( * ) Notice: Subject to any disclaimer, the term of this patent is extended or adjusted under 35 U.S.C. 154(b) by 899 days.

(21) Appl. No.: 11/260,113

(22) Filed: Oct. 28, 2005

Related U.S. Application Data

(60) Provisional application No. 60/684,066, filed on May 23, 2005.

(51) Int. Cl.
  *H04B 1/38* (2006.01)
(52) U.S. Cl. .............. 375/219; 375/220; 375/356; 455/296; 455/73; 370/537; 327/147; 331/14; 710/312
(58) Field of Classification Search ........... 455/296, 455/73; 370/537; 327/147; 331/14; 710/312
  See application file for complete search history.

(56) References Cited

U.S. PATENT DOCUMENTS

| | | | | |
|---|---|---|---|---|
| 5,081,705 A | * | 1/1992 | Swanke | 455/73 |
| 5,385,581 A | * | 1/1995 | Bramm et al. | 623/3.14 |
| 6,147,562 A | * | 11/2000 | Quirmbach | 331/14 |
| 6,202,115 B1 | * | 3/2001 | Khosrowpour | 710/312 |
| 6,345,175 B1 | * | 2/2002 | Murakami | 455/296 |
| 6,760,349 B1 | * | 7/2004 | Ho et al. | 370/537 |
| 2006/0250168 A1 | * | 11/2006 | Starr et al. | 327/147 |

OTHER PUBLICATIONS

Rogers et al. (A Multiband ΔΣ Fractional-N Frequency Synthesizer for a MIMO WLAN Transceiver RFIC; IEEE Journal of Solid-State Circuits, vol. 40, No. 3; Mar. 2005).*
IEEE Journal of Solid-State Circuits, vol. 38, No. 6, Jun. 2003, pp. 1015-1027; A Unified Model for Injection-Locked Frequency Dividers; Shwetabh Verma, Hamid R. Rategh, and Thomas H. Lee, Member.
Proceedings of the I.R.E. and Wave and Electrons; Jun. 1946; A Study of Locking Phenomena in Oscillators, Rober Adler.
IEEE Journal of Solid-State Circuits, vol. 40, No. 8, Aug. 2005, pp. 1629-1641; A Fully Integrated Multiband MIMO WLAN Transceiver RFIC; David G. Rahn, Mark S. Cavin, Fa Foster Dai, Neric H. W. Fong, Richard Griffith, José Macedo, A. David Moore, John W. M. Rogers, and Mike Toner.

* cited by examiner

*Primary Examiner*—Sudhanshu C Pathak

(57) ABSTRACT

A method and circuit for providing coherent phase noise including a clock receiver to receive a clock signal generated external to the circuit and a local clock source arranged on the circuit. The circuit further includes a selector to select an output of one of the clock receiver and the local clock source and a wireless transceiver responsive to an output of the selector.

27 Claims, 19 Drawing Sheets

METHOD AND APPARATUS FOR PROVIDING COHERENT PHASE NOISE IN TRANSCEIVERS OR SIMILAR SYSTEMS

CROSS-REFERENCE TO RELATED APPLICATIONS

This application claims priority under 35 U.S.C. §119(e) to provisional U.S. Patent Application No. 60/684,066, filed on May 23, 2005, the disclosure of which is expressly incorporated by reference herein in its entirety.

BACKGROUND OF THE INVENTION

1. Field of the Invention

The invention is directed generally to a method and apparatus that provides coherent phase noise in transceivers and, more particularly, to providing coherent phase noise in transceivers residing on multiple semiconductor chips by having multiple transceivers share a clock signal.

2. Related Art

To increase bandwidth in a wireless system, multiple transceivers have been used. In particular, use of a multiple input multiple output (MIMO) transceiver system that can transmit and receive simultaneously is one way to significantly increase the bandwidth efficiency of a wireless channel. Such MIMO systems increase the bandwidth and allow for a greater amount of data to be transmitted and received per unit time.

However, it has been found that MIMO systems may have reduced performance because a clock signal, such as a local oscillator signal, in each of the transceivers of the MIMO systems may have a different phase noise and, accordingly, the phase noise of the system is non-coherent. Non-coherent phase noise may adversely impact the MIMO system performance by decreasing bandwidth efficiency.

This application describes a method and apparatus that allows an internal local oscillator in each of the transceiver chips of a multi-chip MIMO system to be configured in either master or slave modes, thus allowing the local oscillator signal generated within the master chip to be distributed among all the slave chips so as to achieve a coherent local oscillator signal among all transceivers within the system.

SUMMARY OF THE INVENTION

The invention provides a method and apparatus that allows for multiple transceivers operating in a MIMO system to share an oscillation signal from a single clock device, such as a local oscillator even when the various transceivers reside on different semiconductor chips. This configuration improves performance and furthermore includes other advantages apparent from the discussion herein.

To minimize the overall system cost and form-factor, when transceivers are used in a MIMO system, the transceivers are ideally physically placed on the same semiconductor chip. Accordingly, a clock device, such as a local oscillator, can easily share a clock signal between the multiple transceivers on a single semiconductor chip. However, due to the physical constraints of, for example, the die size, the pin-out, and signal coupling between multiple transceivers of a MIMO system, the number of transceivers that can be integrated in a single semiconductor chip is very limited. To realize higher order MIMO systems, it is desirable that multiple units of identical MIMO transceiver chips be combined into one MIMO system (i.e. k NXM chips combined into a kM×kN system, where N (M) is the number of receivers (transmitters) in a single chip, an k is the number of chips combined) while still sharing the same coherent local oscillator signal. One way to achieve such configuration is to use a dedicated external local oscillator to generate the local oscillator signal for all the transceiver chips, but such approach will increase cost and compromise the form-factor of the final product.

The invention may be implemented in a number of ways. According to one aspect of the invention an integrated circuit includes a clock receiver to receive a clock signal generated external to the integrated circuit, a local clock source arranged on the integrated circuit, a selector to select an output of one of the clock receiver and the local clock source, and a wireless transceiver responsive to an output of the selector. The local clock source may be a phase lock loop circuit. The integrated circuit may include a local clock transmitter to transmit an output of the selector. The integrated circuit may be in an autonomous mode when the selector selects the output of the local clock source and the local clock transmitter does not transmit an output of the selector. The integrated circuit may be in a slave mode when the selector selects the output of the clock receiver. The integrated circuit may be in a master mode when the selector selects the output of the local clock source. The integrated circuit may be in a repeat mode when the selector selects the output of the clock receiver and the local clock transmitter transmits the output of the selector. The wireless transceiver may be compliant with IEEE 802.11(n). The selector may include a multiplexer. The multiplexer may include an emitter-follower circuit. The clock signal receiver may include a programmable impedance circuit configured with a digital to analog converter that controls an impedance of the clock signal. The integrated circuit may include connections coupleable to at least one antenna. The integrated circuit may further include a first terminal that outputs a first polarity of a clock signal, and a second terminal that outputs a second polarity of the clock signal, the first terminal and the second terminal are arranged on a common side of a package of the integrated circuit, the first terminal is arranged symmetrical with respect to the second terminal on the common side.

According to another aspect of the invention, a wireless MIMO transceiver includes a first integrated circuit that includes a local clock source arranged on the integrated circuit, a first local clock transmitter to transmit an output of the local clock source, and a first wireless transceiver responsive to the local clock source, a second integrated circuit includes a clock receiver to receive a clock signal from the first local clock transmitter of the first integrated circuit, and a second wireless transceiver responsive to the clock receiver. The second integrated circuit further may include a second local clock transmitter to output the clock signal received by the clock receiver from the first integrated circuit, and wherein the wireless MIMO transceiver further may include a third integrated circuit that includes a clock receiver to receive a clock signal from the second local clock transmitter of the second integrated circuit, and a third wireless transceiver responsive to the third clock receiver. The local clock source may include a phase lock loop circuit. The first and second wireless transceivers may be compliant with IEEE 802.11(n).

According to another aspect of the invention, an integrated circuit includes at least one semiconductor die that includes a clock source to provide a differential clock signal, a clock transmitter to output the clock signal to an external device, a wireless transceiver responsive to the clock source, a package for housing the semiconductor die, a first terminal responsive to the clock source to output a first polarity of the differential clock signal, a second terminal responsive to the clock source to output a second polarity of the differential clock signal, wherein the first terminal and the second terminal are arranged on a common side of the package, and the first terminal may be arranged symmetrical with respect to the second terminal on the common side.

According to another aspect of the invention, an integrated circuit includes a clock receiver to receive a clock signal generated external to the integrated circuit, a local clock source arranged on the integrated circuit, a selector to select an output of one of the clock receiver and the local clock source, and a transceiver responsive to an output of the selector.

According to another aspect of the invention a method of transmitting wireless signals includes the steps of one of receiving an externally generated clock signal or generating a local clock signal, selecting either of the externally generated clock signal and the local clock signal, and transmitting wireless signals responsive to the selecting step. The step of generating a local clock signal may include generating a local clock signal with a phase lock loop circuit. The method may further include the step of transmitting the selected one of the externally generated clock signal and the local clock signal. The transmitting may be in an autonomous mode when the local clock signal is selected and is not transmitted. The transmitting may be in slave mode when the externally generated clock signal is selected. The transmitting may be in a repeat mode when the local clock signal may be selected and the local clock signal may be transmitted. The transmitting may be compliant with IEEE 802.11(n).

According to another aspect of the invention, an integrated circuit includes means for receiving a clock signal generated external to the integrated circuit, means for generating a local clock signal arranged on the integrated circuit, means for selecting an output of one of the clock signal receiving means and the local clock generating means, and means for wireless transmitting and receiving responsive to an output of the selecting means. The local clock generating means may include a phase lock loop circuit. The integrated circuit may further include means for transmitting an output of the selecting means. The integrated circuit may be in an autonomous mode when the selecting means selects the output of the local clock means and the output transmitting means does not transmit. The integrated circuit may be in a slave mode when the selecting means selects the output of the receiving means. The integrated circuit may be in a master mode when the selecting means selects the output of the local clock generating means. The integrated circuit may be in a repeat mode when the selecting means selects the output of the receiving means and the transmitting means transmits the output of the selecting means. The wireless transmitting and receiving means may be compliant with IEEE 802.11(n). The selecting means may include a multiplexer, which may include an emitter-follower circuit. The clock signal receiver may include a programmable impedance circuit configured with a digital to analog converter that controls an impedance of the clock signal. The integrated circuit may include means for connecting to at least one antenna. The integrated circuit may further include a first terminal that outputs a first polarity of a clock signal, and a second terminal that outputs a second polarity of the clock signal, the first terminal and the second terminal are arranged on a common side of a package of the integrated circuit, the first terminal is arranged symmetrical with respect to the second terminal on the common side.

According to another aspect of the invention a wireless MIMO transceiver includes a first integrated circuit that includes means for generating a local clock signal arranged on the integrated circuit, means for transmitting an output of the local clock generating means, and means for wireless transmitting and receiving responsive to the local clock generating means, a second integrated circuit that includes means for receiving a clock signal from the transmitting means of the first integrated circuit, and means for wireless transmitting and receiving responsive to the clock signal receiving means. The second integrated circuit further may include a second means for transmitting the local clock signal to transmit the local clock signal received by the clock signal receiver means of the first integrated circuit, and the wireless MIMO transceiver further may include a third integrated circuit that includes means for receiving a clock signal from the second clock signal transmitting means of the second integrated circuit, and means for transmitting and receiving responsive to the clock signal receiving means from the second clock signal transmitting means. The local clock means may include a phase lock loop circuit. The wireless transmitting and receiving means may be compliant with IEEE 802.11(n).

According to another aspect of the invention an integrated circuit includes at least one semiconductor die that includes means for generating a differential clock signal, means for transmitting the differential clock signal to an external device, means for wireless transmitting and receiving responsive to the differential clock signal generating means, means for housing the semiconductor die, a first means for connecting responsive to the differential clock signal generating means to output a first polarity of the differential clock signal, a second means for connecting responsive to the differential clock signal generating means to output a second polarity of the differential clock signal, wherein the first connecting means and the second connecting means are arranged on a common side of the housing means, wherein the first connecting means is arranged symmetrical with respect to the second connecting means on the common side.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1:
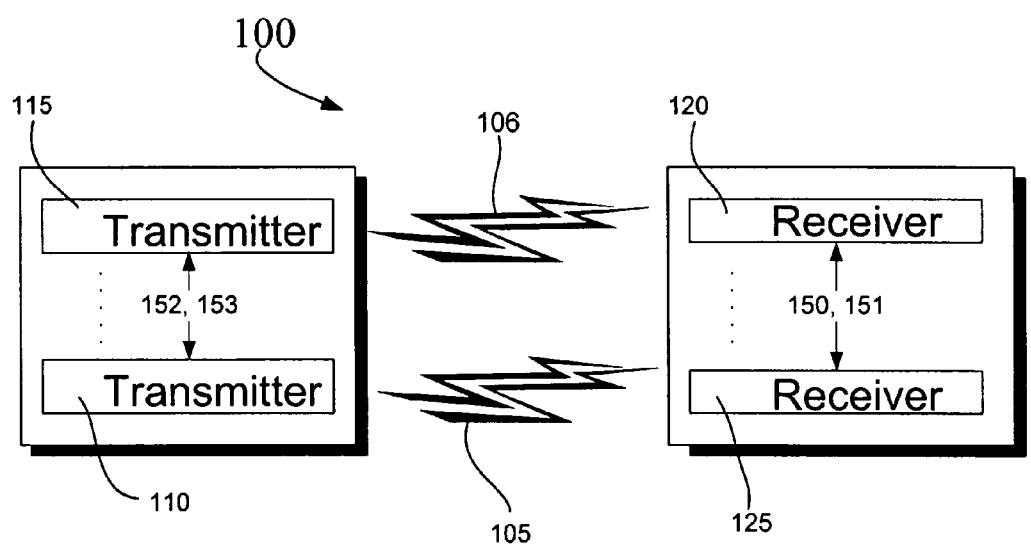
FIG. 1 shows a multiple input multiple output (MIMO) receiver and transmitter system that may use the circuits of the invention to provide coherent phase noise.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

FIG. 1 shows an exemplary multiple input multiple output (MIMO) receiver and transmitter system that may use the circuits of the invention to provide coherent phase noise. More specifically, FIG. 1 schematically shows how the invention may be implemented in a wireless MIMO receiver and transmitter wireless system 100. In particular, the wireless system 100 includes a transmitter 110 that transmits a transmission frame 105 to a receiver 125, and a transmitter 115 that transmits a transmission frame 106 to a receiver 120. Of course, it should be apparent that the transmitters 110, 115 may also include receivers (transceivers) and receivers 120, 125 may include transmitters (transceivers). In addition, there may be more than two transmitters and/or more than two receivers. The receivers 120, 125 and transmitters 110,115 shown in FIG. 1 further includes circuits 150, 151, 152, 153 of the invention, which achieve coherent phase noise and increase the performance of the wireless system 100, as described below.

Figure 2:
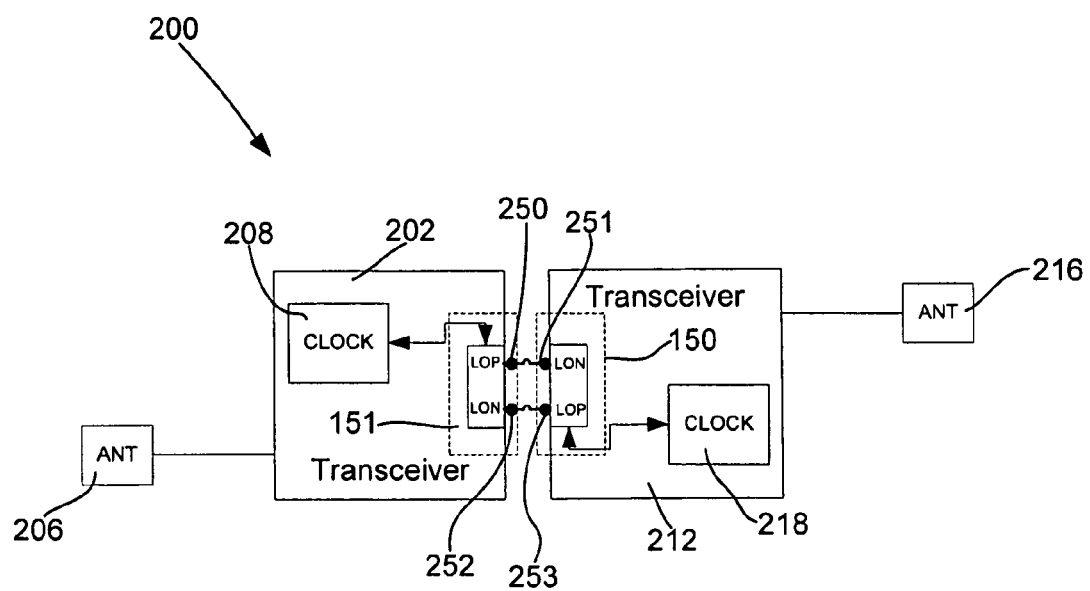
FIG. 2 illustrates a MIMO device including two transceivers that may operate based on a single local clock system of either transceiver, according to the principles of the invention.

FIG. 2 illustrates a MIMO device 200 configured to operate with a single local clock system, such as an oscillator, according to the principles of the invention. In particular, FIG. 2 shows a first transceiver semiconductor chip 202, such as a die housed in a package, and a second transceiver semiconductor chip 212, such as a die housed in a package, that form part of a MIMO device 200. Transceiver chip 202 is connectable to an antenna 206 and a clock system 208, which may be integrated on semiconductor chip 202. In particular, the antenna 206 operates as an air interface to transmit and/or receive transmission frames, based on a signal generated within the transceiver semiconductor chip 202 and the clock 208. Similarly, the transceiver semiconductor chip 212 is connectable to an antenna 216 and a clock system 218, which may be integrated on semiconductor chip 212. Thus, semiconductor chip 212 transmits and/or receives transmission frames in conjunction with antenna 216 based, in part, on clock system 218. Each of the transceivers 202 and 212 may transmit and/or receive, in part, in response to a clock signal from clock 208 or clock 218. Thus, the clock signal may come from the clock 208, which resides on or may be connected to the transceiver chip 202, or the clock 218, which resides on or may be connected to the transceiver chip 212.

More particularly, in order to have more coherent phase noise in the MIMO wireless device 200 shown in FIG. 2, either one of the clocks 208, 218 may also output a local oscillator signal to the other's transceiver via distribution circuits 150, 151. Thus, the clock 208 may output a local oscillator signal to the transceiver 212 and the clock 218 may output a clock signal to the transceiver 202. Accordingly, the signals that are used/received in both transceivers 202, 212 have coherent phase noise because each of the clock signals is based on the same local oscillator signal.

The transceiver chips 202, 212 include input/output pins 250, 251, 252, 253 for the clock signals. The input/output pins LON, LOP, respectively, which have a different polarity to receive and transmit the clock signals, preferably are symmetrically positioned about the center of chips 202 and 212 along the same common side. This allows for use of the same die set in manufacturing the chips 202 and 212. In other words, the chip 202 may be rotated 180 degrees and placed in the same position as chip 212, and chip 212 may also be rotated 180 degrees and placed in the position of chip 202.

The transceiver chips 202 and 212 can operate in at least one of three different modes as described in more detail in conjunction with the discussion of FIGS. 3-6. In a first autonomous mode when it is not necessary for the MIMO device 200 to operate with coherent phase noise, each of the local oscillators runs without communication or sharing of the oscillation frequency signal between the two transceivers 202, 212. In a second master mode, one of the clocks 208 and 218 is used as the master clock source (master local oscillator). In this master mode, the majority of components within the master local oscillator are powered and the clock signals are transmitted from the master local oscillator, such as clock 208, to the slave transceiver 212 or from clock 218 to the slave transceiver 202. In a third slave mode, the transceiver chip 202 or 212 powers down the local oscillator and/or clock and operates by receiving a clock signal from the master transceiver chip that is outputting and operating in the master mode.

Although FIG. 2 is shown with two antennae 206, 216 connected to the transceiver chips 202, 212, any number of antennae may be employed in the MIMO device 200. Moreover, although a single local clock system, such as a crystal oscillator, is shown as 208 and 218, which may be integrated on transceiver chips 202 and 212 respectively, a single clock may be employed on a transceiver chip 202 or 212 whereas the other of the transceiver chips 202 and 212 may be without a clock. Additionally, the transceiver chips 202, 212 may be arranged on a single semiconductor chip or on multiple semiconductor chips. Moreover, the MIMO device may employ additional transceiver chips.

Figure 3:
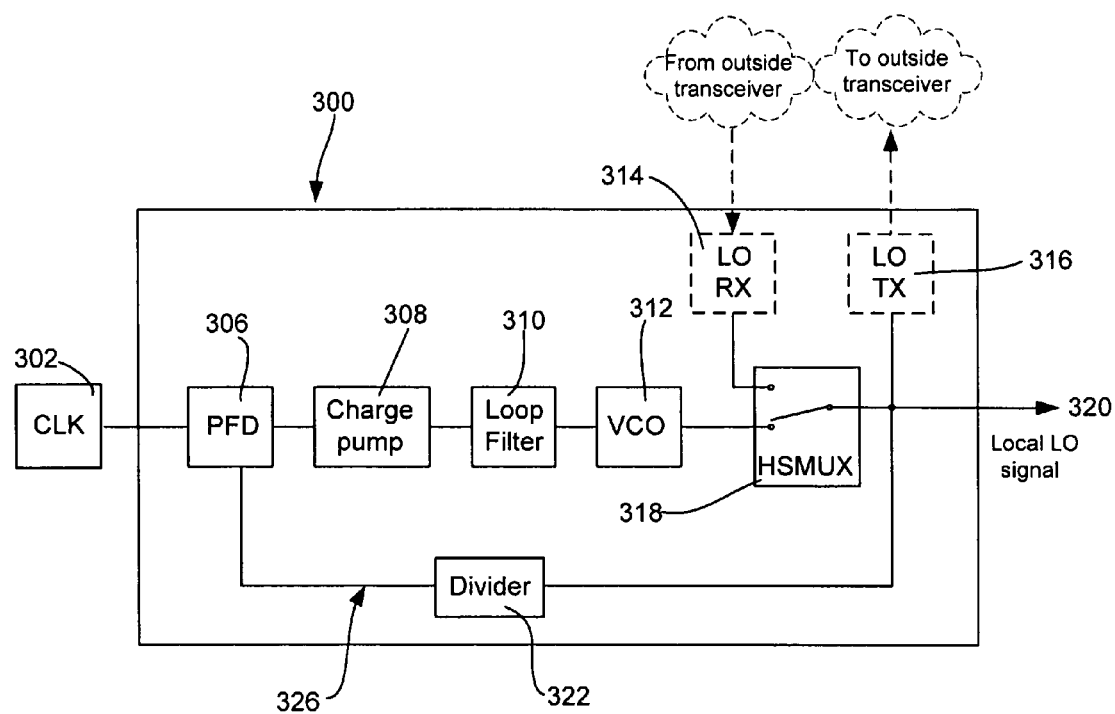
FIGS. 3, 4, 5, and 6 illustrate different operational modes of a clock system implemented as a phase lock loop device, which may be used in a MIMO device, according to the principles of the invention.

FIGS. 3-6 illustrate the different operational modes of a clock system that may be used in a MIMO device constructed according to the principles of the invention. In particular, FIGS. 3-6 show a detailed implementation of the local oscillator clock, such as the clocks 208, 218 of FIG. 2, implemented with a phase lock loop device 300. The phase lock loop device 300 is connectable to an oscillator clock 302, such as a crystal oscillator, as a reference frequency input. Of course any kind of reference frequency source may be employed. The phase lock loop device 300 may employ a phase frequency detector 306, a charge pump 308, a loop filter 310, and a voltage controlled oscillator 312 arranged in a serial fashion. The voltage controlled oscillator 312 oscillates responsive to a voltage received from the loop filter 310. The voltage controlled oscillator 312 outputs to a high speed multiplexer 318. However, any type of multiplexer may be employed. The high speed multiplexer 318 then outputs a local oscillator (LO) signal to be used as the local clock signal 320 for the transceiver chip 202 or 212 and moreover sends the LO signal via feedback loop 326 and a divider circuit 322 to the phase frequency detector 306. In the implementation of FIG. 3, the phase lock loop device 300 is operating in the autonomous mode. As noted above, the autonomous mode operation of the phase lock loop device 300 is for such circumstances when coherent phase noise between the multiple transceivers of the MIMO device 200 is not an issue or required. In such an autonomous mode, the local oscillator operates without receiving an input or transmitting an output to another transceiver.

For the master and slave modes of operation, the phase lock loop device 300 includes a local oscillator receiver ("LORX") 314 and a local oscillator transmitter ("LOTX") 316, which may receive and transmit a clock signal, respectively. Additionally, the local oscillator transmitter 316 provides driving strength to transmit the clock signal. Accordingly, in the autonomous mode, the phase lock loop device 300 does not receive a local oscillator signal in the local oscillator receiver 314 and does not receive a clock signal from local oscillator transmitter 316 (as indicated by the dashed lines) in FIG. 3. Accordingly, the high speed multiplexer 318 selects the output from the voltage control oscillator 312 and the clock signal 320 is output to the transceiver for transceiver operations. Moreover, in the autonomous mode shown in FIG. 3, the local oscillator receiver 314 and the local oscillator transmitter 316 may be powered down, whereas all of the other device components, including the phase frequency detector 306, the charge pump 308, the loop filter 310, and the voltage control oscillator 312 are powered for operation in the phase lock loop device 300 to produce the clock signal 320. All of the components in the device 300 except for LORX 314, LOTX 316, and the high speed multiplexer 318 may be conventional.

Figure 4:
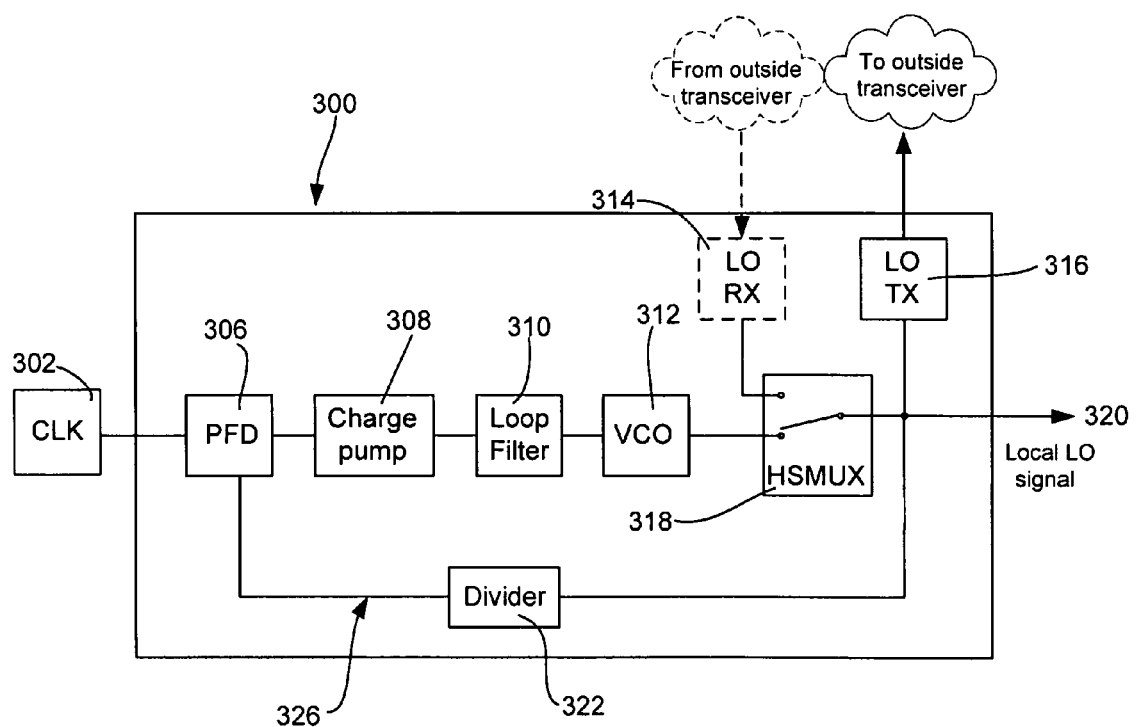

FIG. 4 shows the operation of the phase lock loop device 300 in the master mode of operation. In the master mode, the majority of the components are powered, including the phase frequency detector 306, the charge pump 308, the loop filter 310, the voltage control oscillator 312 and the local oscillator transmitter 316. As shown by the dashed lines, the local oscillator receiver 314 is not powered and does not receive. In this regard, the high speed multiplexer 318 selects the signal that is received via the phase frequency detector 306, the charge pump 308, the loop filter 310, and the voltage control oscillator 312, and outputs this as the local oscillator clock signal 320. Moreover, the high speed multiplexer 318 also outputs this clock signal to the local oscillator transmitter 316. The local oscillator transmitter 316 then transmits the clock signal to an adjoining, or similarly situated transceiver chip, such as transceiver chip 212 shown in FIG. 2.

Figure 5:
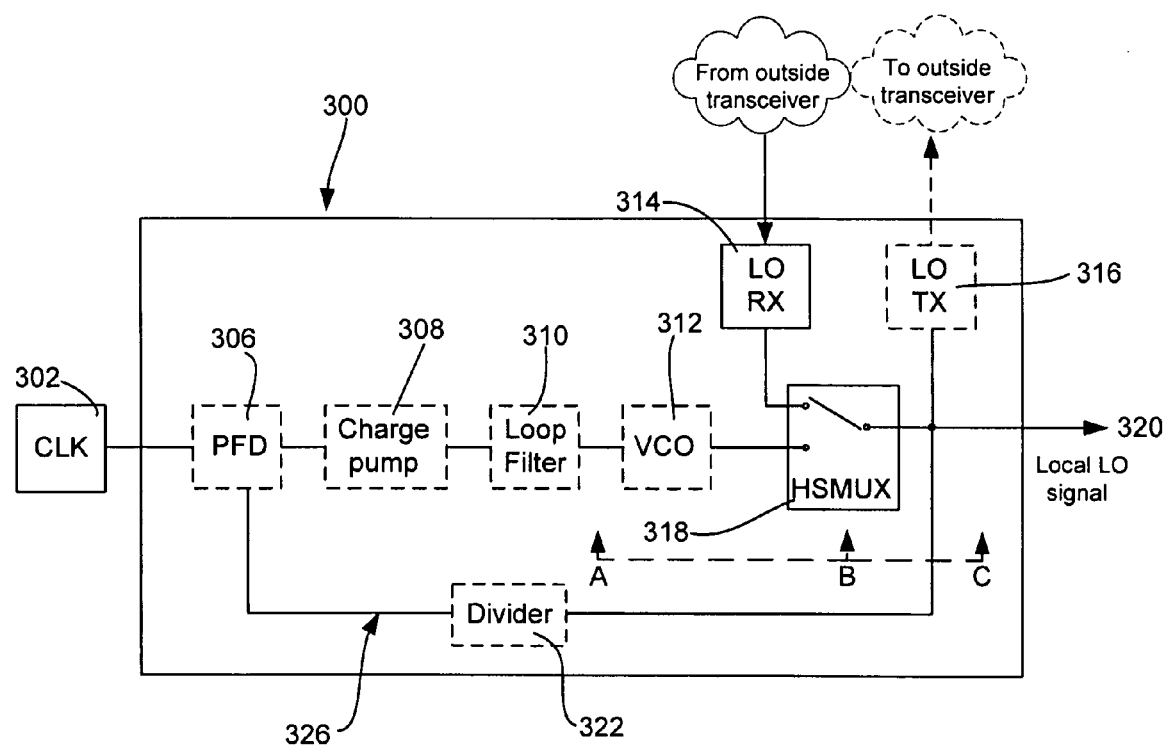

FIG. 5 shows the operation of the phase lock loop device 300 when it operates in the slave mode. In particular, the phase frequency detector 306, the charge pump 308, the loop filter 310, the divider 322, and the voltage control oscillator 312 are all powered down as shown by dashed lines. This is because the clock signal generated from each of these components is not needed. On the other hand, the local oscillator receiver 314 is powered and receives a clock signal from an outside transceiver and/or clock source. The high speed multiplexer 318 is set to select the signal that is received by local oscillator receiver 314, and this signal is output as the clock signal 320 to the transceiver chip.

It should be noted that the high speed multiplexer 318 shown in FIGS. 3-6 may be arranged at various positions within the phase lock loop device 300. FIG. 5 shows multiplexer 318 at position B. However, it is contemplated that the high speed multiplexer 318 may be placed anywhere such that the multiplexer 318 may be responsive to a clock source 302. For example, the high speed multiplexer 318 may be arranged outside the phase lock loop device 300 at position C, together with or without the local oscillator receiver 314, and local oscillator transmitter 316 with similar results. In such an embodiment, the local oscillator receiver 314 and local oscillator transmitter 316 are connected in a similar configuration as shown by an exemplary implementation in FIG. 7. The FIG. 7 implementation is shown in master mode. Alternatively, the high speed multiplexer 318 may be arranged before the voltage controlled oscillator 312 inside the phase lock loop device 300 at position A shown in FIG. 8. In such an embodiment, the high speed multiplexer 318 injects a clock signal into the voltage controlled oscillator 312 from the local oscillator receiver 314 as shown by an exemplary implementation in FIG. 8. The FIG. 8 implementation is shown in slave mode. The local oscillator receiver 314 and local oscillator transmitter 316 may be connected with a similar configuration.

Figure 6:
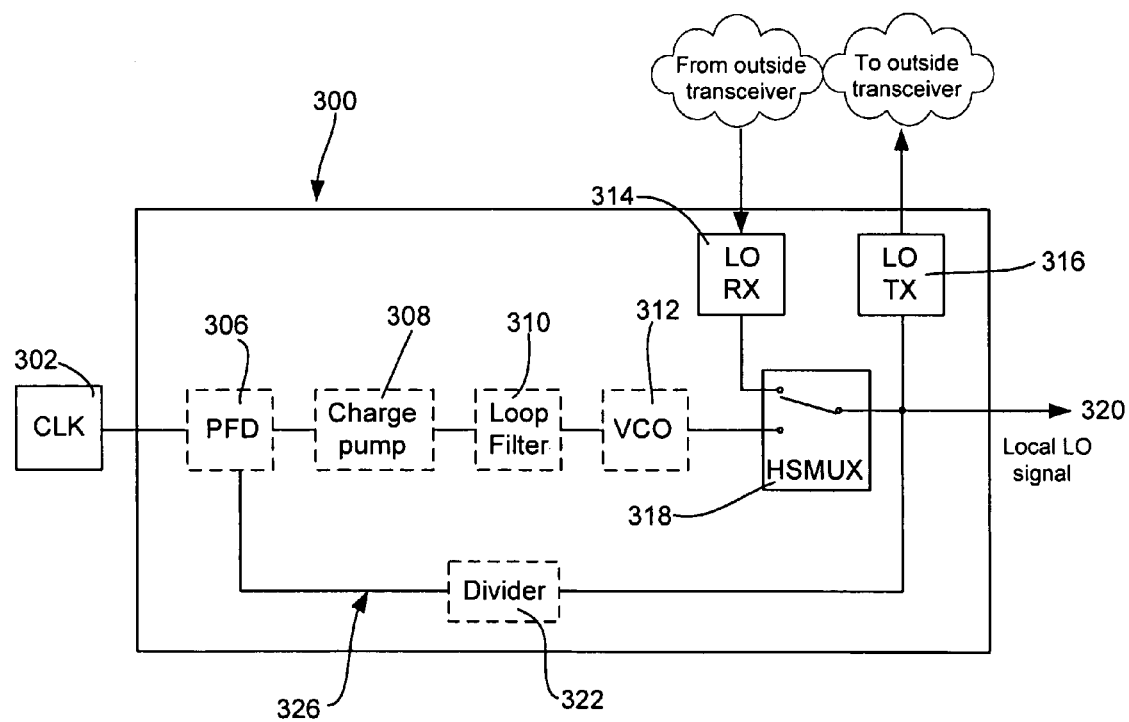
Figure 7:
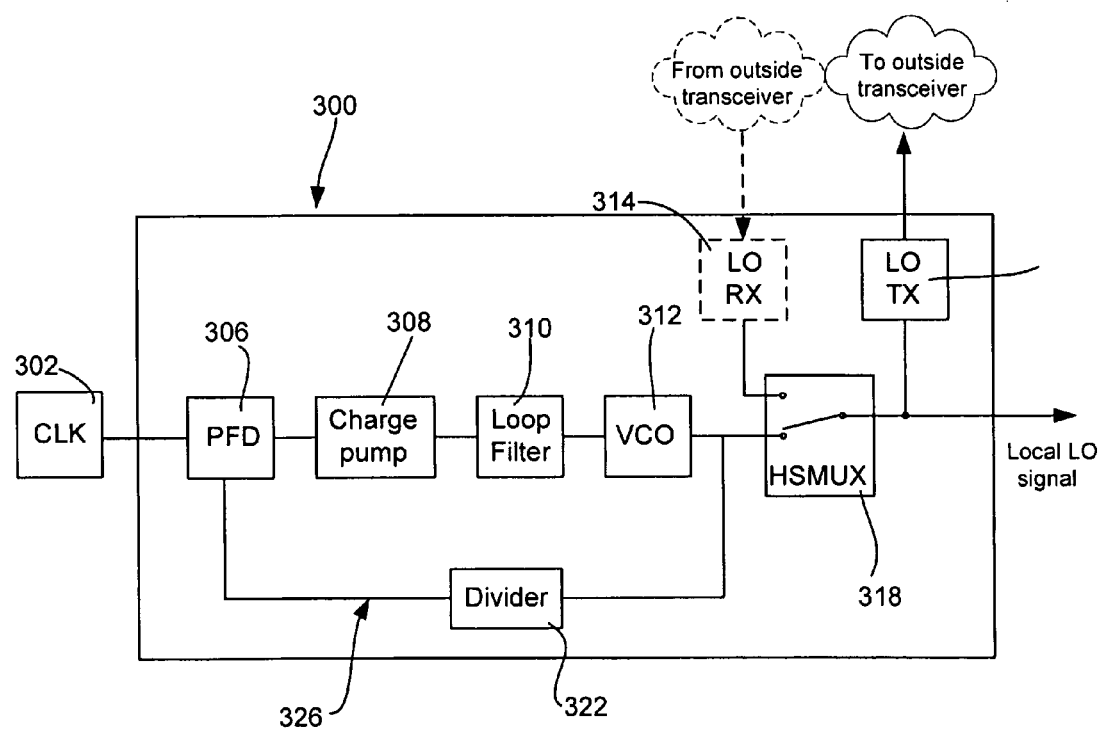
FIGS. 7 and 8 illustrate different arrangements of the clock system shown in FIGS. 3, 4, 5 and 6.

FIG. 6 shows an alternative operation of the phase lock loop device 300 for the slave mode in which a plurality of transceivers may be daisy-chained together, as described below. In FIG. 6, the phase frequency detector 306, the charge pump 308, the loop filter 310, the divider 322 and the voltage control oscillator 312 are all powered down as shown by dashed lines. On the other hand, the local oscillator receiver 314 is powered and receives a clock signal from an outside transceiver and/or clock source. The high speed multiplexer 318 is set to select the signal that is received by local oscillator receiver 314, and this signal is output as the clock signal 320 to the transceiver chip. Moreover, the local oscillator transmitter 316 is also powered so that the received clock signal may also be transmitted to another transceiver also operating in a slave mode. Accordingly, a plurality of the transceivers may be daisy-chained together in this manner and have coherent phase noise in their clock signal in such a repeat mode.

Furthermore, it is noted that although a phase lock loop device 300 is shown in the embodiments of FIGS. 3-8 as the clock source, any known clock source and/or crystal timing source may be employed for use with the high speed multiplexer 318 together with the local oscillator receiver 314 and local oscillator transmitter 316. In addition to the daisy-chained configuration, the system can also be configured such that a single master drives multiple slaves in a star-connection style (i.e. a single master simultaneously drives multiple slaves).

Figure 8:
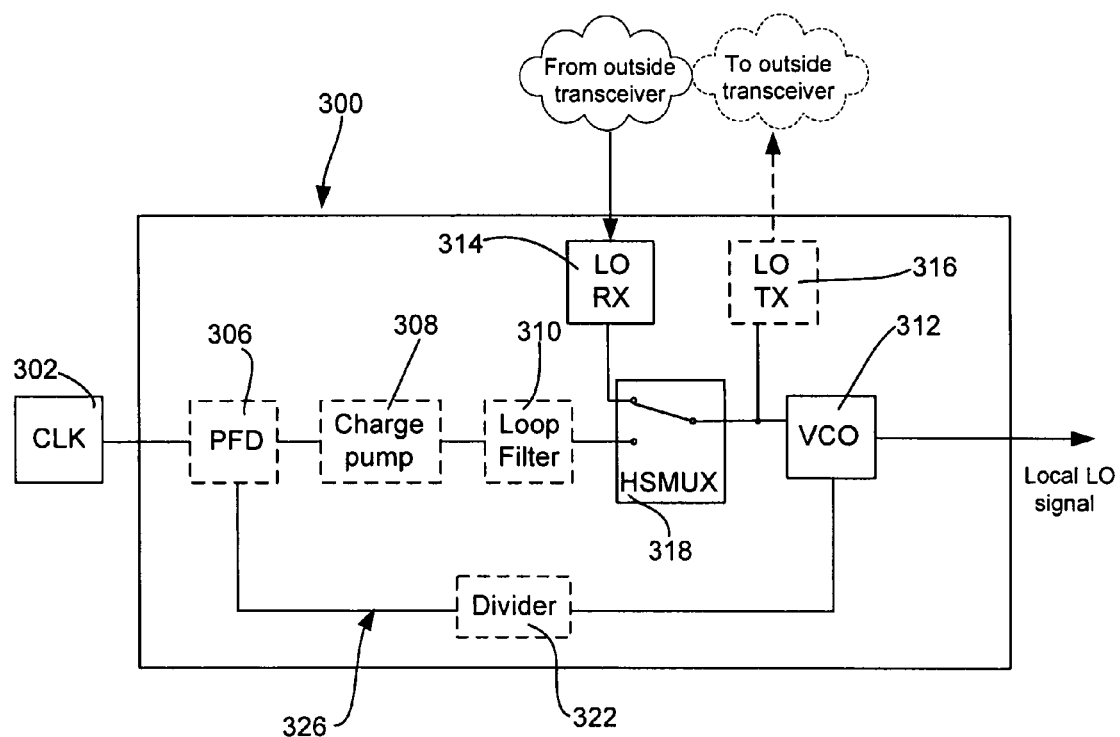
Figure 9:
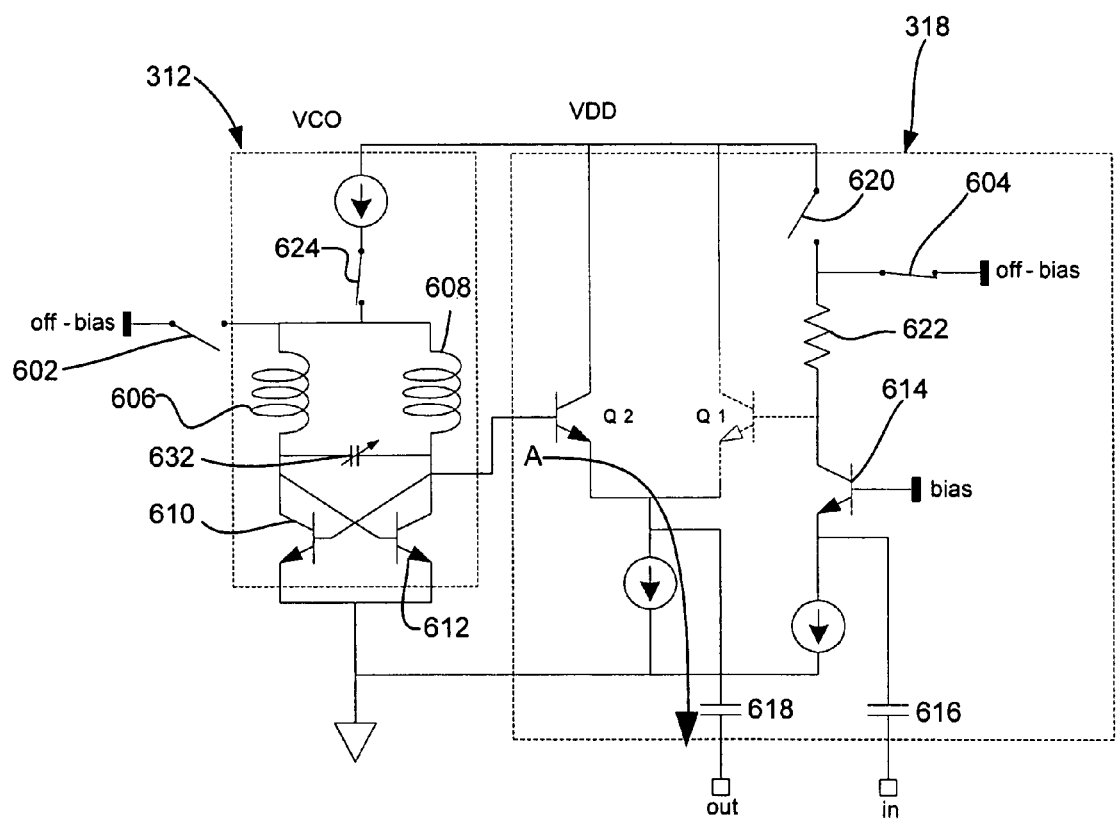
FIGS. 9, 10, and 11 illustrate different operational modes of a high speed multiplexer and/or voltage controlled oscillator constructed according to the principles of the invention, which may be used in a phase lock loop device, such as the clock system in FIGS. 3-8.
Figure 10:
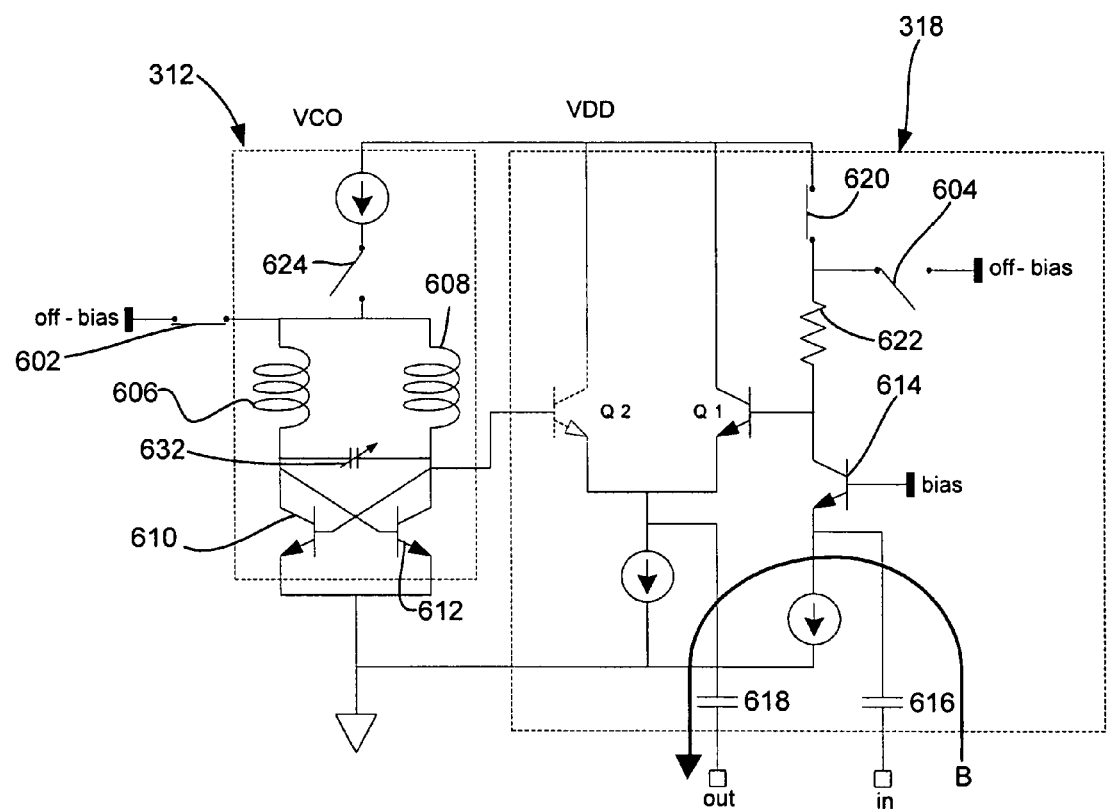

FIGS. 9 and 10 illustrate different operational modes of a high speed multiplexer that may be used in a clock system such as the clock system in FIGS. 3-8. In particular, FIGS. 9 and 10 show a voltage controlled oscillator, which may be the voltage controlled oscillator 312 shown in FIGS. 3-8, interconnected to a high speed multiplexer, which may be the high speed multiplexer 318 shown in FIGS. 3-8. In a particular detailed embodiment of FIGS. 9 and 10, the high speed multiplexer 318 may be operated as an emitter-follower. The high speed multiplexer 318 configured as an emitter-follower has minimal parasitic tendencies as compared with a simple emitter-follower buffer.

More specifically, the voltage controlled oscillator 312 shown in FIG. 9 includes an inductor 606 and an inductor 608. The inductors 606, 608 are each connected to a respective collector of switches 610 and 612 and also connected to a variable capacitor 632. The switches 610, 612 are further cross-connected to inductors 606, 608 at a respective base of each of the switches 610, 612. The emitter portions of switches 610, 612 are combined and grounded. The output of the voltage controlled oscillator is input to the base of the switch Q2 and the emitter of the switch Q2 provides the oscillation frequency signal. Additionally, the voltage controlled oscillator 312 includes a switch 624 to control power to the voltage controlled oscillator 312 as supplied from the voltage source VDD. Additionally, a switch 602 connects the inductors 606, 608 to an off-bias source. However, it should again be noted that the voltage controlled oscillator 312 in the FIGS. 3-8 embodiments may employ a different construction and/or configuration.

The high speed multiplexer 318 of the FIGS. 9 and 10 embodiment includes a switch pair Q1, Q2. The collector of the switch pair Q1, Q2 is connected to voltage source VDD and the emitter portion of switches Q1 and Q2 are combined and connected to a capacitor 618. The capacitor 618 outputs to the multiplexer output "out" of the high speed multiplexer 318. The switch pair Q1, Q2 may have substantially the same proportions. Moreover, the configuration of Q1 and Q2 in the multiplexer 318 with emitter-follower structure of FIGS. 9 and 10 results in minimal parasitic and also results in minimal stress on the circuit.

The voltage controlled oscillator 312 is powered by the voltage source VDD when the switch 624 is closed as shown in FIG. 9. The voltage controlled oscillator 312 forms an oscillation frequency signal with at least the inductors 606, 608 and switches 610, 612 that is output to the base of switch Q2. When the switch 602, which is connected to an off-bias is opened, the switch 604 is connected to an off-bias is closed, and switch 620 is opened, switch Q1 is disabled (as shown by the dash lines) and switch Q2 is enabled. This allows the signal from voltage controlled oscillator 312 to be selected and to flow from the voltage controlled oscillator 312 to the high speed multiplexer 318 to the "out" node as shown by arrow A. During this mode, the off-bias voltage is chosen such that it may maintain transistor Q1 in the cut-off region through the entire operation cycle without inducing reverse base-emitter breakdown on the transistor.

As shown in FIG. 10, when it is desired to not have the voltage controlled oscillator 312 signal selected by the high speed multiplexer 318, the switch 602 is closed and the switch 604 is opened. Moreover, the switch 624 opens to disconnect power from the voltage controlled oscillator 312 and the switch 620 is closed to connect the voltage source VDD to resistor 622. This enables switch Q1 and disables switch Q2 (as shown by the dash lines). In this regard, the signal that is received from the local oscillator receiver 314 is input to the "in" node. From the "in" node the input signal enters the capacitor 616, and the input signal travels through capacitor 618 to the "out" node as generally shown by the arrow B. The off-bias voltage during this mode is chosen to maintain Q2 in the cut-off region throughout the entire operation cycle, yet without inducing reverse be breakdown on the transistor.

Figure 11:
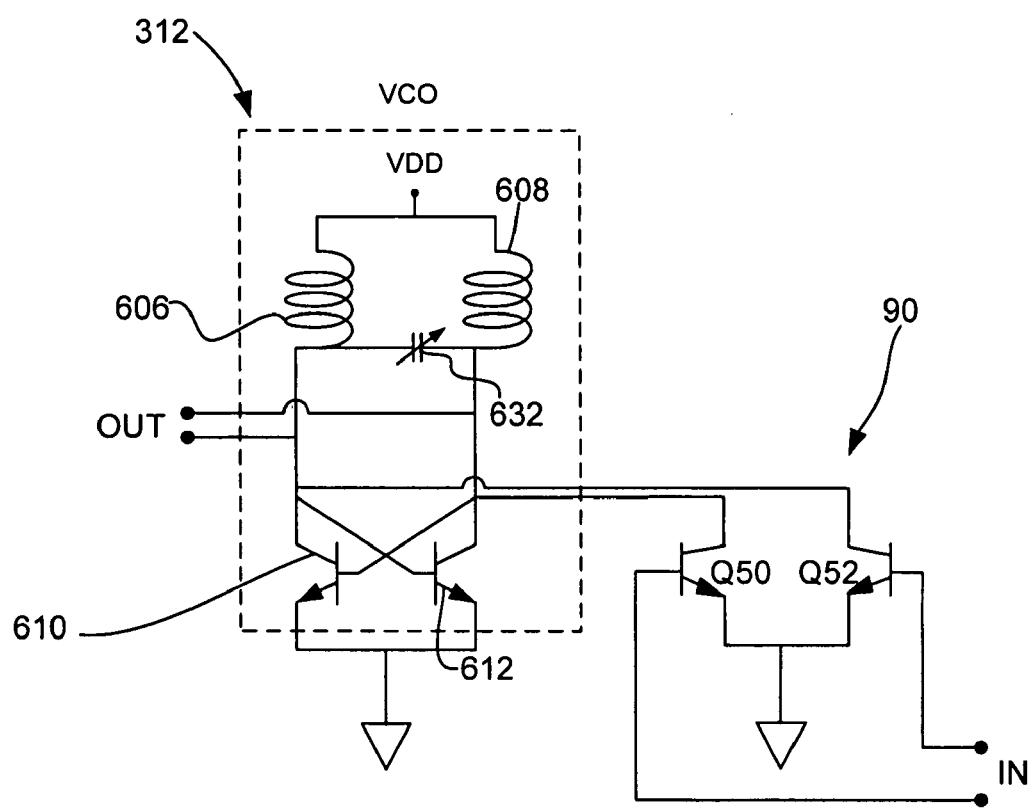

FIG. 11 shows an alternative embodiment of the FIGS. 9 and 10 device. In particular, FIG. 11 shows a detailed portion of the voltage controlled oscillator 312 that again includes an inductor 606 and an inductor 608 and switches 610, 612 together with a variable capacitor 632. However, in this embodiment the high speed multiplexer 318 (not shown in FIG. 11) is positioned in position A as shown in FIG. 5 and FIG. 8. Accordingly the output of the high speed multiplexer 318 (not shown in FIG. 11) is injected into the voltage controlled oscillator 312 at the IN node of a circuit 90 used to assist in the injection of the signal. The circuit 90 includes a switch pair Q50 and Q52 connected to the voltage controlled oscillator 312. In this regard, an input from the high speed multiplexer 318 is received at the IN node of circuit 90. The output of the voltage controlled oscillator is the clock signal and this is output at the OUT node.

Figure 12:
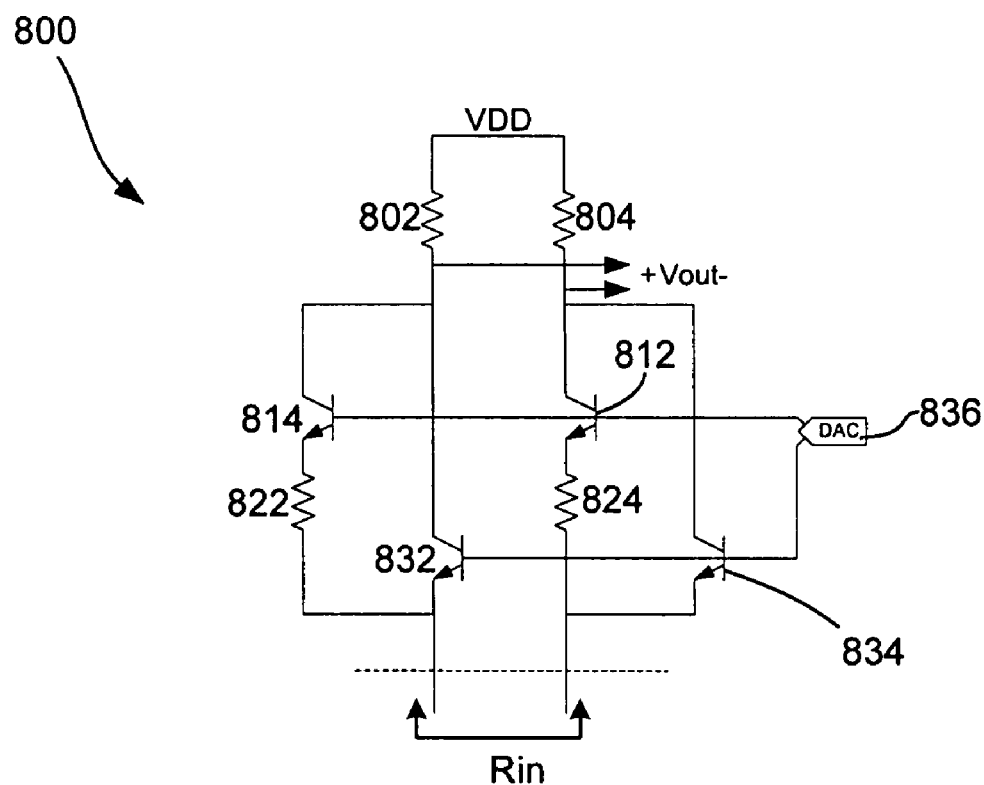
FIG. 12 illustrates a portion of a programmable input impedance local oscillator receiver (LORX) that may be used in a clock system constructed according to the principles of the invention, such as the clock system in FIGS. 3-8.

FIG. 12 illustrates a portion of a programmable input impedance local oscillator receiver LORX of the invention that may be used in a clock system, such as the phase lock loop device in FIGS. 3-8. More specifically, FIG. 12 shows a front-end portion of a variable programmable input impedance local oscillator receiver circuit 800. The circuit 800 is used in conjunction with the local oscillator receiver 314 which may also employ a buffer.

In particular, the programmable input impedance local oscillator receiver circuit 800 receives the local oscillator signal at the Rin node. The output of the programmable input impedance local oscillator receiver 800 is output from the two resistors 802 and 804 shown as Vout. In particular, the signal is received in the Rin node at the emitters of switch 832 and switch 834. The signal also is received in resistors 822 and 824. The resistors 822 and 824 are respectively connected to the emitters of switches 814 and 812. Now the base of switches 814, 812, 834 and 832 is connected to and controlled by a digital to analog converter (DAC) 836. The digital to analog controller 836 outputs a differential voltage. In operation, the programmable input impedance local oscillator receiver circuit 800 is controlled by the DAC 836 differential voltage. In particular, when the voltage is low, then the switches 814 and 812 are inactive and the received input goes from "Rin," has an impedance of 1/Gm, and is output at Vout. On the other hand, when the input voltage is high, switches 832 and 834 are inactive while switches 814 and 812 are active and the voltage from Rin across these switches is R based on in part the resistors 822, 824. In this regard, the impedance across the programmable input impedance local oscillator receiver 800 is always 1. Accordingly, the programmable input impedance local oscillator receiver circuit 800 allows reception of the clock signal from an outside transceiver with impedance that can be programmed in the local oscillation receiver LORX 314 of FIGS. 3-8.

Figure 13:
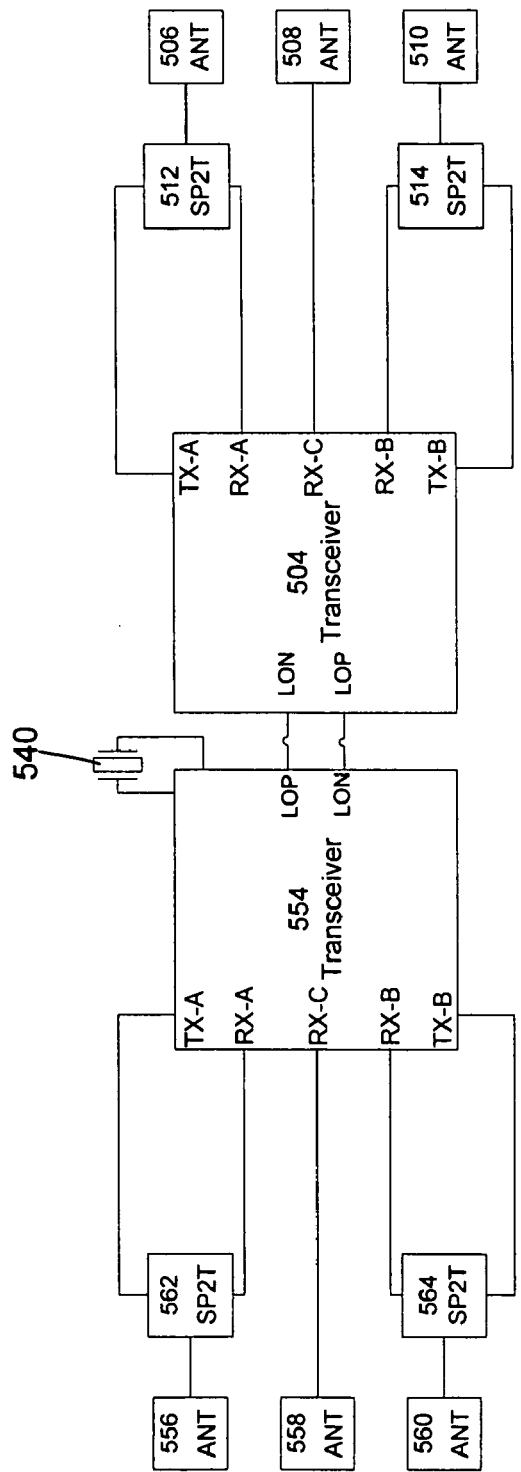
FIG. 13 is a more detailed embodiment of a MIMO device constructed according to the principles of the invention.

FIG. 13 is a more detailed embodiment of a MIMO device constructed according to the principles of the invention using two transceiver chips 554 and 504. The transceiver chip 504 is connectable to a local oscillator receive line LON and a local oscillator transmit line LOP. Similarly, the transceiver chip 554 also includes a local oscillator receive line LON and a local oscillator transmit line LOP. The LOP and LON connections in each chip preferably are centered and symmetrically disposed on the same side of the semiconductor chip. The transceiver chip 554 may include connections to a clock 540 that may employ a clock crystal. In this manner, these multiple transceivers operating in a MIMO device share a single clock device even when the various transceivers reside on different semiconductor chips.

In particular, transceiver chip 504 in this particular implementation is configured with two transmitters (TX-A, TX-B) and three receivers (RX-A, RX-B, RX-C). More specifically, the transceiver 504 is connected to a single pole double throw switch 512 that selectively connects a transmitter (TX-A) to an antenna 506. Similarly, the transceiver 504 is connected to another single pole double throw switch 514 and to an antenna 510 for another transmitter (TX-B). Accordingly, antennae 506 and 510 transmit signals from the two transmitters. The receivers (RX-A, RX-B, RX-C) on the other hand receive their signals via antennae 506, 508, and 510. More specifically, antenna 506 receives a signal that is input to single pole double throw switch 512 before it is received in the transceiver circuit chip 504. Antenna 508 receives a signal that is directly input into transceiver chip 504. Finally, the third receiver is implemented via antenna 510, which inputs into a single pole double throw switch 514, which is then input into transceiver chip 504.

Similarly, transceiver chip 554 in this particular implementation is configured with two transmitters (TX-A, TX-B) and three receivers (RX-A, RX-B, RX-C) also, however different numbers of each may be employed. More specifically, the transceiver 554 is connected to a single pole double throw switch 562 that selectively connects a transmitter (TX-A) to an antenna 556. Similarly, the transceiver 554 is connected to another single pole double throw circuit 564 and to an antenna 560 for another transmitter (TX-B). Accordingly, antennae 556 and 560 transmit signals from the two transmitters. The receivers (RX-A, RX-B, RX-C) on the other hand receive their signals via antennae 556, 558, and 560. More specifically, antenna 556 receives a signal that is input to single pole double throw switch 562 before it is received in the transceiver circuit chip 554. Antenna 558 receives a signal that is directly input into transceiver chip 554. Finally, the third receiver is implemented via antenna 560, which inputs into a single pole double throw switch 564, which is then input into transceiver chip 554.

As noted above, transceivers 504 and 554, particularly LOP and LON connections, may have the same semiconductor chip symmetrical configuration. More specifically, the pin-out connections may be centered and symmetrically arranged along a common side of the semiconductor chip to allow the chip to operate as a slave or master chip. This results in a cost savings for manufacturing. However, two differently configured chips may be employed and operate in accordance with the principles of the invention.

Although the particular embodiment shown in FIG. 13 shows two transceiver chips 554 and 504, each having three receivers and two transmitters, any number of transceiver chips may be used. Moreover, transceiver chips 554, 504 may each have any number of receivers and any number of transmitters.

Additionally, although the two transceiver chips 504 and 554 are shown with the transceiver 504 receiving a clock signal from the transceiver chip 554, transceiver chip 554 may directly broadcast the clock signal to many transceiver chips. Alternatively, transceiver chip 554 may transmit to a single chip which transmits to another chip in a daisy chain fashion as discussed in conjunction with FIG. 6.

Figure 14:
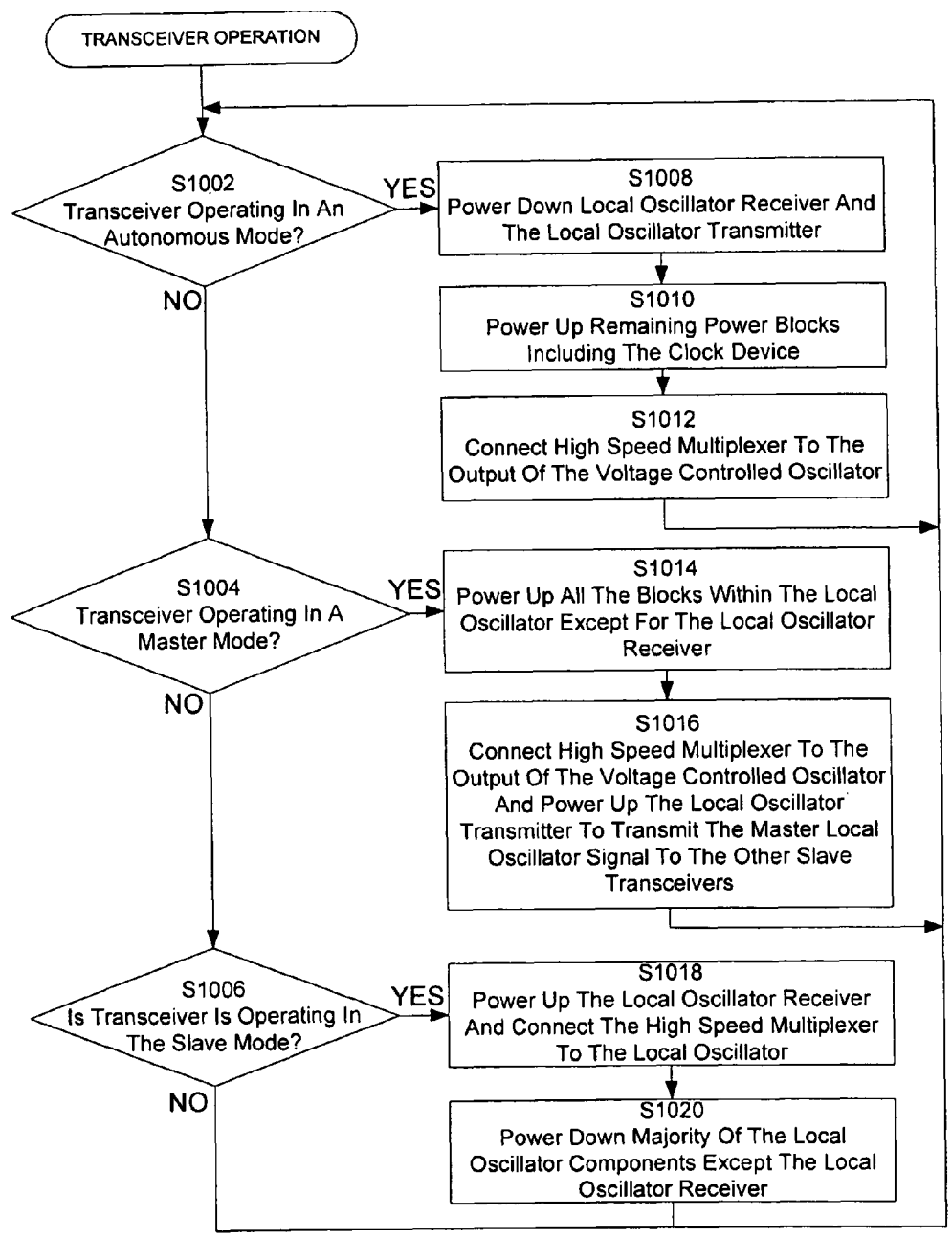
FIG. 14 is an exemplary operational flow chart of the MIMO device constructed according to the principles of the invention.

FIG. 14 is an exemplary operational flow chart of the MIMO device constructed according to the principles of the invention. In particular, FIG. 14 shows a method of operating wireless transceivers of a MIMO device according to the invention. At step S1002, it is determined whether or not a particular transceiver is operating in an autonomous mode. When a particular wireless transceiver is operating in the autonomous mode S1002, the logic flows to step S1008. In step S1008, the local oscillator receiver and the local oscillator transmitter are all powered down. Next in step S1010, the remaining power blocks are powered up and, in particular, the clock device, such as a phase lock loop device is powered. Next, the high speed multiplexer then is connected to the output of the voltage controlled oscillator in step S1012. It should be noted that the steps S1008, S1010, and S1012 are shown separately and in a particular order merely for illustrative purposes only. Each of these steps may be executed at the same time or in an entirely different order.

On the other hand, if at step S1002, it is determined that the transceiver is not operating in the autonomous mode, the logic flows to step S1004. In step S1004, it is determined whether the wireless transceiver is operating in a master mode. When it is determined that the wireless transceiver is operating in a master mode, logic flows to step S1014. In particular, in step S1014, all the blocks within the local oscillator are powered up except for the local oscillator receiver. In step S1016, the high speed multiplexer is connected to the output of the clock source, such as a voltage controlled oscillator, and the local oscillator transmitter is also powered to transmit the master local oscillator signal to other slave transceivers for master mode operation. It should be noted that the steps S1014 and S1016 are shown separately and in a particular order merely for illustrative purposes only. Each of these steps may be executed at the same time or in an entirely different order.

On the other hand, if at step S1002, it is determined that the transceiver is not operating in the autonomous mode and in step S1004 it is determined that the transceiver is not operating the master mode, the logic flows to step S1006. In step S1006 it is determined whether or not the transceiver is operating in the slave mode. If a wire transceiver is operating in the slave mode, the logic flows from step S1006 to step S1018. In particular, at step S1018, the majority of the local oscillator components are powered down with the exception of a local oscillator receiver. In step S1020, the local oscillator receiver is powered up and is connected to the high speed multiplexer. The high speed multiplexer then connects the local oscillator receiver and outputs the local oscillator for slave mode operations. Again, it should be noted that the steps S1018 and S1020 are shown separately and in a particular order merely for illustrative purposes only. Each of these steps may be executed at the same time or in an entirely different order.

In accordance with various embodiments of the invention, the methods described herein are intended for operation with dedicated hardware implementations including, but not limited to, semiconductors, application specific integrated circuits, programmable logic arrays, and other hardware devices constructed to implement the methods and modules described herein.

It should be noted that the invention may employ any wireless protocol that may benefit from increased performance. Moreover, any future enhancement of a current protocol or any future protocol is contemplated for use with the invention.

Figure 15:
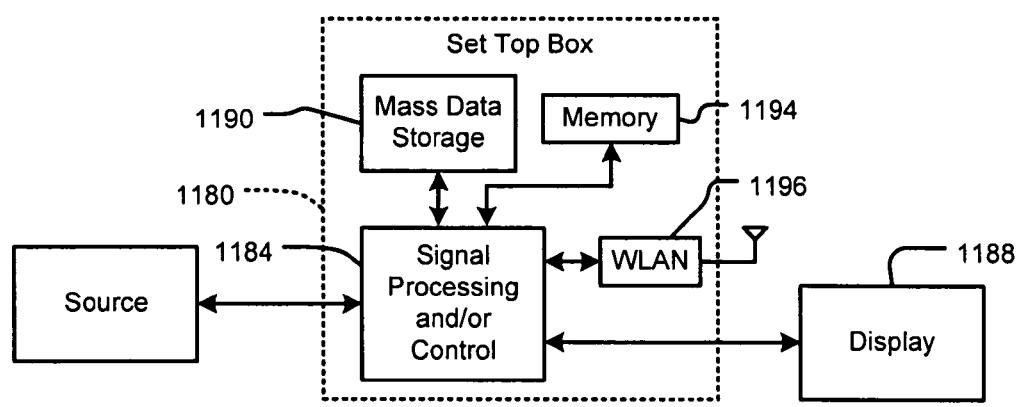
FIGS. 15, 16, 17, 18, and 19 show various exemplary implementations of the invention.

The invention can be implemented in a variety of devices, some of which are specifically described in more detail below. Referring now to FIG. 15, the invention can be implemented in a set top box 1180. The invention may implement either or both signal processing and/or control circuits, which are generally identified in FIG. 15 at 1184, a WLAN interface and/or mass data storage of the set top box 1180. The set top box 1180 receives signals from a source such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

The set top box 1180 may communicate with mass data storage 1190 that stores data in a nonvolatile manner. The mass data storage 1190 may include optical and/or magnetic storage devices for example hard disk drives HDD and/or DVDs. The HDD may be a mini HDD that includes one or more platters having a diameter that is smaller than approximately 1.8". The set top box 1180 may be connected to memory 1194 such as RAM, ROM, low latency nonvolatile memory such as flash memory and/or other suitable electronic data storage. The set top box 1180 also may support connections with a WLAN via a WLAN network interface 1196 constructed according the principles of the invention.

Figure 16:
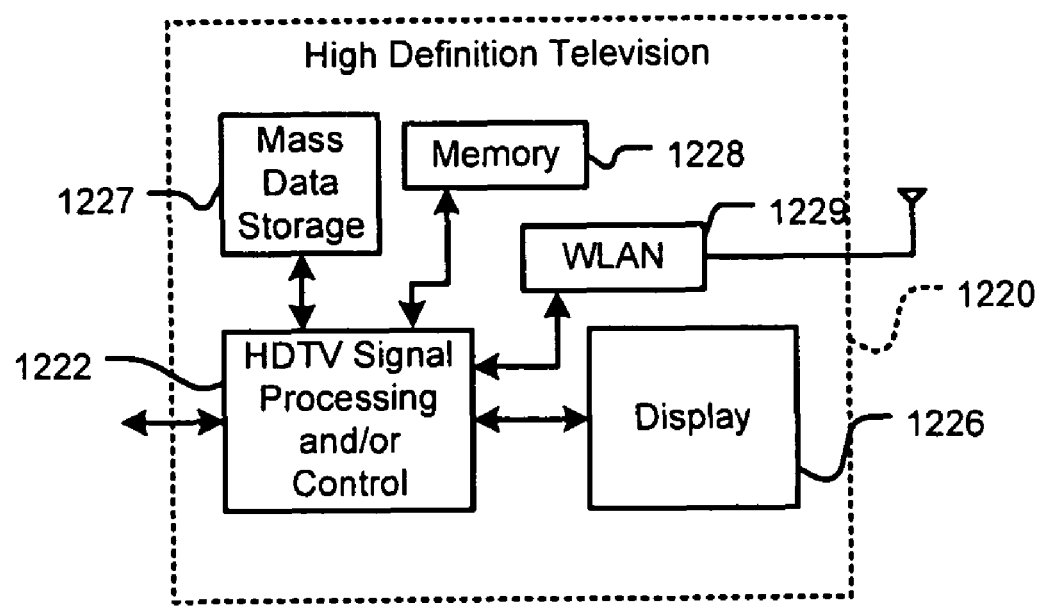

Referring now to FIG. 16, the invention can be implemented in a high definition television (HDTV) 1220. The invention may implement either or both signal processing and/or control circuits, which are generally identified in FIG. 16 at 1222, a WLAN interface and/or mass data storage of the HDTV 1220. The HDTV 1220 receives HDTV input signals in either a wired or wireless format and generates HDTV output signals for a display 1226. In some implementations, signal processing circuit and/or control circuit 1222 and/or other circuits (not shown) of the HDTV 1220 may process data, perform coding and/or encryption, perform calculations, format data and/or perform any other type of HDTV processing that may be required.

The HDTV 1220 may communicate with mass data storage 1227 that stores data in a nonvolatile manner such as optical and/or magnetic storage devices. The HDD may be a mini HDD that includes one or more platters having a diameter that is smaller than approximately 1.8". The HDTV 1220 may be connected to memory 1228 such as RAM, ROM, low latency nonvolatile memory such as flash memory and/or other suitable electronic data storage. The HDTV 1220 also may support connections with a WLAN via a WLAN network interface 1229 constructed according the principles of the invention.

Figure 17:
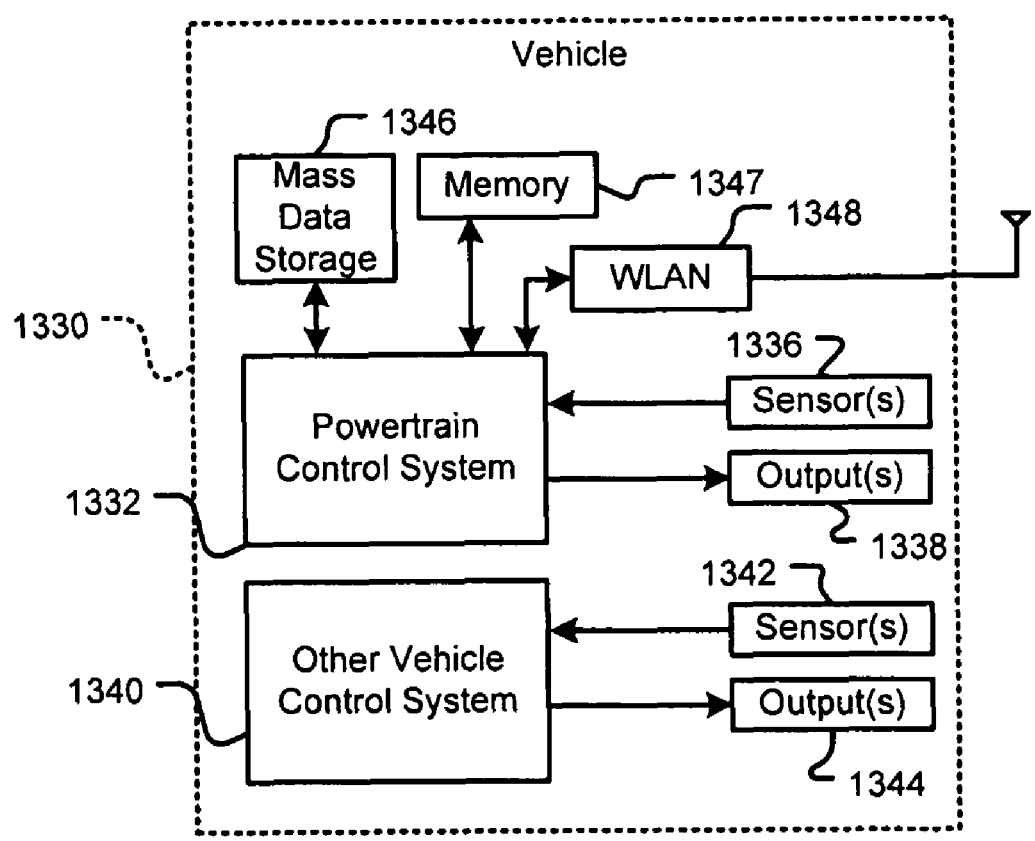

Referring now to FIG. 17, the invention can be implemented in a control system of a vehicle 1330, a WLAN interface and/or mass data storage of the vehicle control system. In some implementations, the invention can be used in a powertrain control system 1332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The invention may also be implemented in other control systems 1340 of the vehicle 1330. The control system 1340 may likewise receive signals from input sensors 1342 and/or output control signals to one or more output devices 1344. In some implementations, the control system 1340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1332 may communicate with mass data storage 1346 that stores data in a nonvolatile manner. The mass data storage 1346 may include optical and/or magnetic storage devices for example hard disk drives HDD and/or DVDs. The HDD may be a mini HDD that includes one or more platters having a diameter that is smaller than approximately 1.8". The powertrain control system 1332 may be connected to memory 1347 such as RAM, ROM, low latency nonvolatile memory such as flash memory and/or other suitable electronic data storage. The powertrain control system 1332 also may support connections with a WLAN via a WLAN network interface 1348 constructed according the principles of the invention. The control system 1340 may also include mass data storage, memory and/or a WLAN interface (all not shown).

Figure 18:
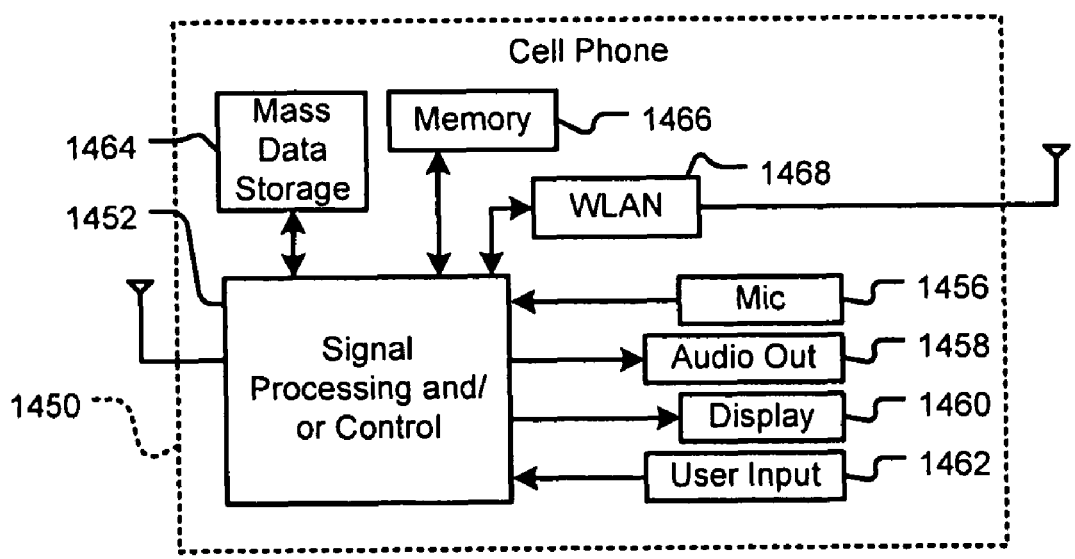

Referring now to FIG. 18, the invention can be implemented in a cellular phone 1450 that may include a cellular antenna 1451. The invention may implement either or both signal processing and/or control circuits, which are generally identified in FIG. 18 at 1452, a WLAN interface and/or mass data storage of the cellular phone 1450. In some implementations, the cellular phone 1450 includes a microphone 1456, an audio output 1458 such as a speaker and/or audio output jack, a display 1460 and/or an input device 1462 such as a keypad, pointing device, voice actuation and/or other input device. The signal processing and/or control circuits 1452 and/or other circuits (not shown) in the cellular phone 1450 may process data, perform coding and/or encryption, perform calculations, format data and/or perform other cellular phone functions.

The cellular phone 1450 may communicate with mass data storage 1464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 1450 may be connected to memory 1466 such as RAM, ROM, low latency nonvolatile memory such as flash memory and/or other suitable electronic data storage. The cellular phone 1450 also may support connections with a WLAN via a WLAN network interface 1468 constructed according to the principles of the invention.

Figure 19:
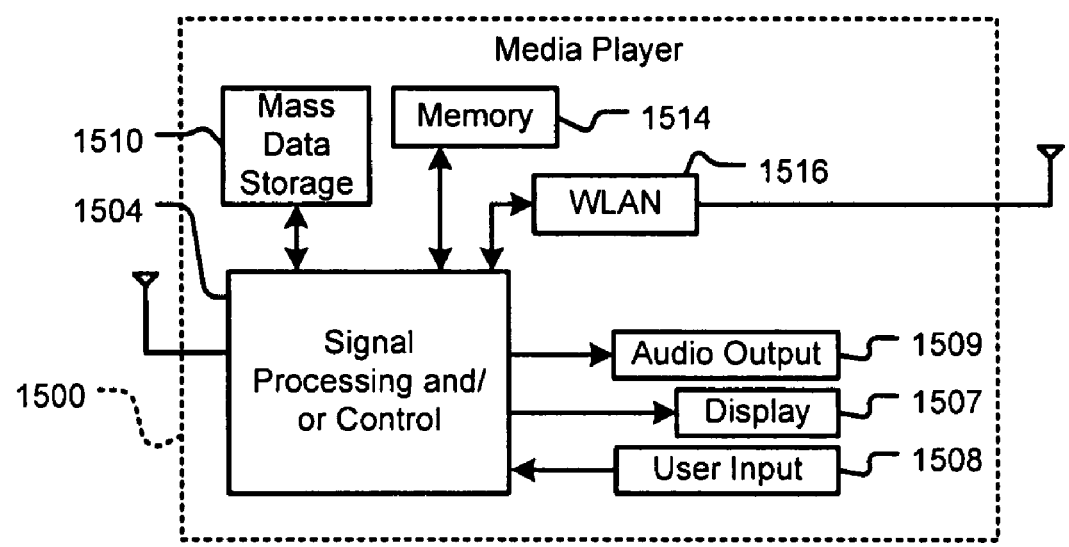

Referring now to FIG. 19, the invention can be implemented in a media player 1500. The invention may implement either or both signal processing and/or control circuits, which are generally identified in FIG. 19 at 1504, a WLAN interface and/or mass data storage of the media player 1500. In some implementations, the media player 1500 includes a display 1507 and/or a user input 1508 such as a keypad, touchpad and the like. In some implementations, the media player 1500 may employ a graphical user interface (GUI) that typically employs menus, drop down menus, icons and/or a point-and-click interface via the display 1507 and/or user input 1508. The media player 1500 further includes an audio output 1509 such as a speaker and/or audio output jack. The signal processing and/or control circuits 1504 and/or other circuits (not shown) of the media player 1500 may process data, perform coding and/or encryption, perform calculations, format data and/or perform any other media player function.

The media player 1500 may communicate with mass data storage 1510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 1500 may be connected to memory 1514 such as RAM, ROM, low latency nonvolatile memory such as flash memory and/or other suitable electronic data storage. The media player 1500 also may support connections with a WLAN via a WLAN network interface 1516 constructed according the principles of the invention. Still other implementations in addition to those described above are contemplated.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. An integrated circuit comprising:
a clock receiver configured to receive an external clock signal generated external to the integrated circuit;
a local clock source arranged on the integrated circuit and configured to generate a local clock signal;
a selector configured to select one of said external clock signal and said local clock signal;
a clock transmitter configured to transmit the selected one of the said external clock signal and said local clock signal externally to the integrated circuit; and
a wireless transceiver configured to determine which one of a plurality modes to operate and further configured to operate in a determined one of the plurality of modes, wherein the plurality modes comprise:
an autonomous mode in which said selector selects the local clock signal;
a master mode in which said selector selects the local clock signal and said clock transmitter transmits the selected local clock signal;
a slave mode in which said selector selects the external clock signal; and
a repeat mode in which said selector selects the external clock signal and said clock transmitter transmits the selected external clock signal,
wherein the wireless transceiver activates the local clock source and deactivates the clock receiver and the clock transmitter in the autonomous mode,
wherein the wireless transceiver activates the local clock source and the clock transmitter and deactivates the clock receiver in the master mode,
wherein the wireless transceiver activates the clock receiver and deactivates the local clock source and the clock transmitter in the slave mode, and
wherein the wireless transceiver activates the clock receiver and the clock transmitter and deactivates the local clock source in the repeat mode.

2. The integrated circuit according to claim 1, wherein said local clock source comprises a phase lock loop circuit.

3. The integrated circuit according to claim 1, wherein said wireless transceiver is compliant with IEEE 802.11(n).

4. The integrated circuit according to claim 1 wherein said selector comprises a multiplexer.

5. The integrated circuit according to claim 4 wherein said multiplexer comprises an emitter-follower circuit.

6. The integrated circuit according to claim 1 wherein said clock receiver comprises a programmable impedance circuit configured with a digital to analog converter that controls an impedance of the external clock signal.

7. The integrated circuit according to claim 1 wherein said integrated circuit further comprises connections coupleable to at least one antenna.

8. The integrated circuit according to claim 1 further comprising:
a first terminal that outputs a first polarity of a clock signal; and
a second terminal that outputs a second polarity of the clock signal,
wherein said first terminal and said second terminal are arranged on a common side of a package of the integrated circuit, wherein said first terminal is arranged symmetrical with respect to said second terminal on the common side.

9. A wireless MIMO transceiver comprising the integrated circuit of claim 1.

10. The wireless MIMO transceiver according to claim 9, comprising a plurality of the integrated circuits.

11. The wireless MIMO transceiver according to claim 10, wherein the plurality of the integrated circuits comprise a first integrated circuit and a second integrated circuit connected to the first integrated circuit,
wherein the first integrated circuit operates in the autonomous mode when the second integrated circuit operates in the autonomous mode, and
wherein the first integrated circuit operates in the master mode when the second integrated circuit operates in the slave mode.

12. The wireless MIMO transceiver according to claim 11, wherein the plurality of the integrated circuits further comprise a third integrated circuit coupled between the first integrated circuit and the second integrated circuit,
wherein the third integrated circuit operates in the repeat mode when the first integrated operates in the master mode and the second integrated circuit operates in the slave mode.

13. An integrated circuit comprising:
a clock receiver configured to receive an external clock signal generated external to the integrated circuit;
a local clock source arranged on the integrated circuit and configured to generate a local clock signal;
a selector configured to select one of the external clock signal and the local clock signal;
a clock transmitter configured to transmit the selected one of the external clock signal and the local clock signal; and
a transceiver configured to determine which one of a plurality of modes to operate and further configured to operate in a determined one of the plurality of modes,
wherein the plurality modes comprise:
an autonomous mode in which said selector is activated to select the local clock signal to operate the transceiver based on the selected local clock signal;
a master mode in which said selector and said clock transmitter are activated to select and transmit the local clock signal and to operate the transceiver based on the selected local clock signal;
a slave mode in which said clock receiver and said selector are activated to receive and select the external clock signal and to operate the transceiver based on the selected external clock signal; and
a repeat mode in which said clock receiver, said selector and said clock transmitter are activated to receive, select and transmit the external clock signal and to operate the transceiver based on the selected external clock signal,
wherein the clock receiver and the clock transmitter are deactivated in the autonomous mode, the clock receiver is deactivated in the master mode, the local clock source and the clock transmitter are deactivated in the slave mode, and the local clock source is deactivated in the repeat mode.

14. A method of operating an integrated circuit comprising a wireless transceiver configured to determine which one of a plurality of modes to operate and further configured to operate in a determined one of the plurality of operational modes, the plurality of operational modes comprising an autonomous mode, a master mode, a slave mode and a repeat mode, the method comprising the steps of:

generating a local clock signal internally within the integrated circuit in the autonomous mode and the master mode;

receiving an external clock signal in the slave mode and the repeat mode;

selecting the local clock signal in the autonomous mode and the master mode and the external clock signal in the slave mode and the repeat mode;

transmitting the selected local signal in the master mode and the selected external signal in the slave mode and the repeat mode; and operating the integrated circuit based on the selected one of the local clock signal and the external clock signal, wherein the wireless transceiver comprises a clock receiver configured to receive the external clock signal, a local clock source configured to generate the local clock signal, and a clock transmitter configured to transmit one of the external clock signal and the local clock signal, the method further comprising:

activating the clock receiver to receive the external clock signal in the slave mode and the repeat mode;

activating the local clock source to generate the local clock signal in the autonomous mode and the master mode;

activating the clock transmitter in the master mode and the repeat mode to transmit the local clock signal in the master mode and to transmit the external clock signal in the repeat mode;

deactivating the clock receiver in the autonomous mode and the master mode;

deactivating the local clock source in the slave mode and the repeat mode; and deactivating the clock transmitter in the autonomous mode and the slave mode.

15. The method according to claim 14, wherein the step of generating a local clock signal comprises generating a local clock signal with a phase lock loop circuit.

16. An integrated circuit comprising:

means for receiving an external clock signal generated external to the integrated circuit;

means for generating a local clock signal arranged on the integrated circuit;

means for selecting one of said external clock signal and said local clock signal;

means for transmitting the selected one of said external clock signal and said local clock signal externally to the integrated circuit;

means for determining one of a plurality of operational modes and operating the integrated circuit in a determined one of the plurality of operational modes, wherein the plurality modes comprise:

an autonomous mode in which said selecting means selects the local clock signal;

a master mode in which said selecting means selects the local clock signal and said transmitting means transmits the selected local clock signal;

a slave mode in which said selecting means selects the external clock signal; and a repeat mode in which said selecting means selects the external clock signal and said transmitting means transmits the selected external clock signal;

wherein the receiving means is activated in the slave mode and the repeat mode;

wherein the generating means is activated in the autonomous mode and the master mode;

wherein the transmitting means is activated in the master mode and the repeat mode;

wherein the receiving means is deactivated in the autonomous mode and the master mode;

wherein the generating means is deactivated in the slave mode and the repeat mode; and wherein the transmitting means is deactivated in the autonomous mode and the slave mode.

17. The integrated circuit according to claim 16, wherein said generating means comprises a phase lock loop circuit.

18. The integrated circuit according to claim 16 wherein said selecting means comprises a multiplexer.

19. The integrated circuit according to claim 18 wherein said multiplexer comprises an emitter-follower circuit.

20. The integrated circuit according to claim 16 wherein said receiving means comprises a programmable impedance circuit configured with a digital to analog converter that controls an impedance of the external clock signal.

21. The integrated circuit according to claim 16 further comprising:

a first terminal that outputs a first polarity of a clock signal; and a second terminal that outputs a second polarity of the clock signal, wherein said first terminal and said second terminal are arranged on a common side of a package of the integrated circuit, wherein said first terminal is arranged symmetrical with respect to said second terminal on the common side.

22. The integrated circuit according to claim 16 further comprising means for connecting to at least one antenna.

23. A wireless MIMO transceiver comprising the integrated circuit of claim 16.

24. The wireless MIMO transceiver according to claim 23, comprising a plurality of the integrated circuits.

25. The integrated circuit according to claim 24, wherein the plurality of integrated circuits comprise a first integrated circuit and a second integrated circuit connected to the first integrated circuit, wherein the first integrated circuit operates in the autonomous mode when the second integrated circuit operates in the autonomous mode, and wherein the first integrated circuit operates in the master mode when the second integrated circuit operates in the slave mode.

26. The integrated circuit according to claim 25, wherein the plurality of the integrated circuits further comprise a third integrated circuit coupled between the first integrated circuit and the second integrated circuit, wherein the third integrated circuit operates in the repeat mode when the first integrated circuit operates in the master mode and the second integrated circuit operates in the slave mode.

27. The integrated circuit of claim 16, wherein the determining means operate the integrated circuit based on the local clock signal in the autonomous mode and the master mode and operate the integrated circuit based on the external clock signal in the slave mode and the repeat mode.

* * * * *